(12) United States Patent
Deng et al.

(10) Patent No.: US 8,174,914 B2
(45) Date of Patent: *May 8, 2012

(54) METHOD AND STRUCTURE FOR SRAM VMIN/VMAX MEASUREMENT

(75) Inventors: Xiaowei Deng, Plano, TX (US); Wah Kit Loh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/584,219

(22) Filed: Sep. 1, 2009

(65) Prior Publication Data
US 2011/0051539 A1    Mar. 3, 2011

(51) Int. Cl.
*G11C 7/00* (2006.01)
(52) U.S. Cl. ........................ 365/201; 365/205
(58) Field of Classification Search .................. 365/201, 365/205
See application file for complete search history.

(56) References Cited

U.S. PATENT DOCUMENTS

| | | | | |
|---|---|---|---|---|
| 5,325,054 A * | 6/1994 | Houston | ............ | 324/762.01 |
| 6,172,907 B1 * | 1/2001 | Jenne | ............ | 365/185.18 |
| 7,656,698 B1 * | 2/2010 | Poplevine et al. | ............ | 365/154 |
| 2002/0079942 A1 * | 6/2002 | Proebsting | ............ | 327/277 |
| 2008/0112212 A1 * | 5/2008 | Wang et al. | ............ | 365/154 |

OTHER PUBLICATIONS

Deng et al., "Method and Structure for SRAM Cell Trip Voltage Measurement," U.S. Nonprovisional Patent Application Filed Sep. 1, 2009; U.S. Appl. No. 12/584,220. Texas Instruments Incorporated.

* cited by examiner

*Primary Examiner* — Michael Tran
(74) *Attorney, Agent, or Firm* — Rose Alyssa Keagy; Wade J. Brady, III; Frederick J. Telecky, Jr.

(57) ABSTRACT

A parametric test circuit is disclosed (FIG. 8B). The test circuit includes a latch circuit having true and complementary terminals. A first access transistor (206) has a current path connected between the true terminal and a first access terminal (214) and has a first control terminal. A second access transistor (208) has a current path connected between the complementary terminal and a second access terminal (216) and has a second control terminal connected to the first control terminal. A multiplex circuit (804) is arranged to apply a first voltage (VDD1) to the first power supply terminal in response to a first state of a select signal (SEL) and to apply a second voltage (VDD2) to the first power supply terminal in response to a second state of a select signal.

26 Claims, 6 Drawing Sheets

METHOD AND STRUCTURE FOR SRAM VMIN/VMAX MEASUREMENT

CROSS-REFERENCE TO RELATED APPLICATIONS

Cross-reference is made to commonly assigned patent application Ser. No. 12/584,220 entitled "METHOD AND STRUCTURE FOR SRAM CELL TRIP VOLTAGE MEASUREMENT" filed Sep. 1, 2009, the teachings of which are incorporated herein by reference in their entirety.

BACKGROUND OF THE INVENTION

Embodiments of the present invention relate to an improved method and circuit for measuring a minimum (Vmin) and maximum (Vmax) operating voltage of a static random access memory (SRAM) cell of a semiconductor integrated circuit.

Shrinking semiconductor integrated circuit feature sizes have placed increasing challenges on semiconductor integrated circuit testing. In particular, semiconductor integrated memory circuits require complex production testers to determine memory pattern sensitivity at various voltages and temperatures. In addition, parametric test systems are frequently employed in a production environment to determine various operating parameters of individual memory cells. Present sub-micron feature sizes and reduced operating voltages require precise determination of memory cell operating parameters such as trip voltage (Vtrip), minimum and maximum operating voltages, static noise margin, data retention, and others. Second order effects that might have been ignored a decade ago are now critical to reliable and cost-effective circuit operation as will be explained in detail.

FIG. 1 is a block diagram of a parametric test system 100 of the prior art. The parametric test system includes several programmable source measure units (SMUs) 102 and a suitable receptacle or socket 104 for a device under test (DUT). Each source measure unit is arranged to either force voltage and measure current or force current and measure voltage. The DUT may be a production memory circuit operating in a design for test mode or a test circuit for measuring a specific parameter.

Turning now to FIG. 2A, there is a six transistor (6-T) static random access memory (SRAM) cell of the prior art. The 6-T cell includes P-channel drive transistors 202 and 204 and N-channel drive transistors 210 and 212. The drive transistors are connected in a cross coupled manner between true storage node (SNT) 230 and complementary storage node (SNB) 232 as shown to form a latch. N-channel access transistors 206 and 208 couple the latch to true bit line (BLT) data terminal 214 and complementary bit line (BLB) data terminal 216, respectively, in response to a high level of word line (WL) 200 for read and write operations. Alternatively, a low level of word line 200 turns off access transistors 206 and 208 to isolate the memory cell from BLT 214 and BLB 216 and store a data state. As shown, the data state of the memory cell is a true one when the SNT node stores a '1' and the SNB node stores a '0'. In this state, transistors 202 and 212 are on and transistors 204 and 210 are off. By convention, the true bit line current (IBLT) and the complementary bit line current (IBLB) are defined as positive current from the respective bit line into the memory cell.

Referring now to FIG. 2B, there is a timing diagram of a memory cell minimum disturb operating voltage (Vmindis) test of the prior art. Vmindis is the minimum voltage at which the memory cell does not fail during read disturb. Supply voltage VSS is held at a low or reference level throughout the test. Bit line voltages VBLT and VBLB are held at a high level throughout the test. A true one (FIG. 2A) is initially written into the memory cell. Supply voltage VDD and word line voltage VWL are incrementally stepped to successively lower voltages 220-224 and 230-234, respectively, as IBLB is monitored. IBLB is initially high due to current flow through N-channel transistors 208 and 212. At a sufficiently low voltage, however, the memory cell changes state so that transistors 204 and 210 are on and transistors 202 and 212 are off. When transistor 212 is off, current flow through series-connected transistors 208 and 212 abruptly drops to zero as shown at 240. This abrupt drop in current IBLB identifies Vmin as the voltage between step 222 and step 224. Accuracy of this measurement depends on resolution of the VDD steps as well as the test equipment. The present inventors have identified a need for improvement as will be discussed in detail.

BRIEF SUMMARY OF THE INVENTION

In a preferred embodiment of the present invention, a parametric test circuit for a semiconductor memory is disclosed. The circuit includes a latch circuit having true and complementary terminals and a power supply terminal. A first access transistor has a current path connected between the true terminal and a first access terminal and having a first control terminal. A second access transistor has a current path connected between the complementary terminal and a second access terminal and has a second control terminal connected to the first control terminal. A multiplex circuit is arranged to apply a first voltage to the power supply terminal in response to a first state of a select signal and to apply a second voltage to the power supply terminal in response to a second state of a select signal.

DETAILED DESCRIPTION OF THE INVENTION

The preferred embodiments of the present invention provide significant advantages in accuracy of the memory cell operating voltage parametric test as will become evident from the following detailed description.

Figure 1:
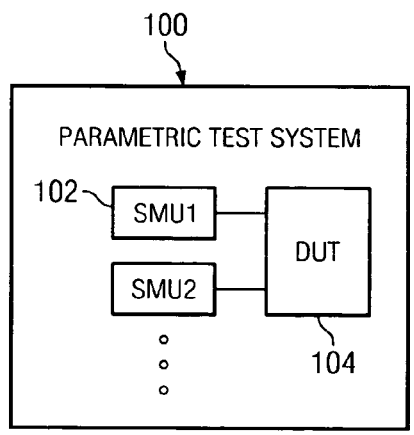
FIG. 1 is a block diagram of a parametric test system of the prior art.
Figure 2B:
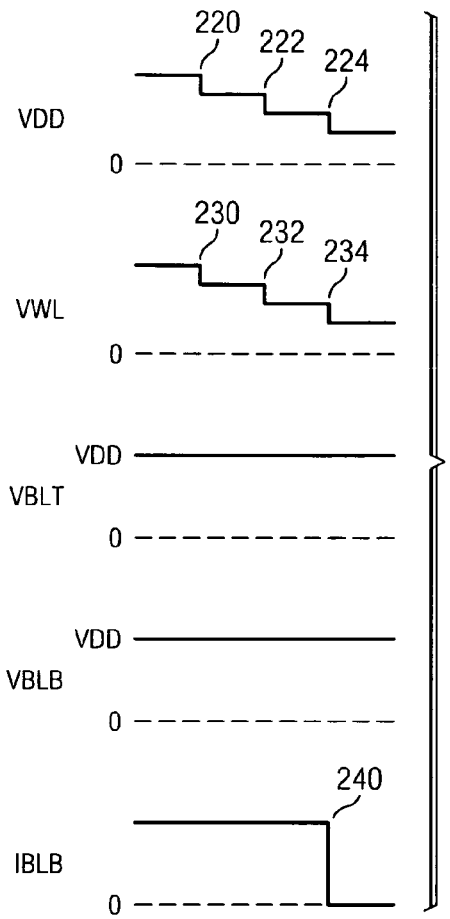
FIG. 2B is a timing diagram of a memory cell minimum disturb operating voltage (Vmindis) parametric test of the prior art.
Figure 2A:
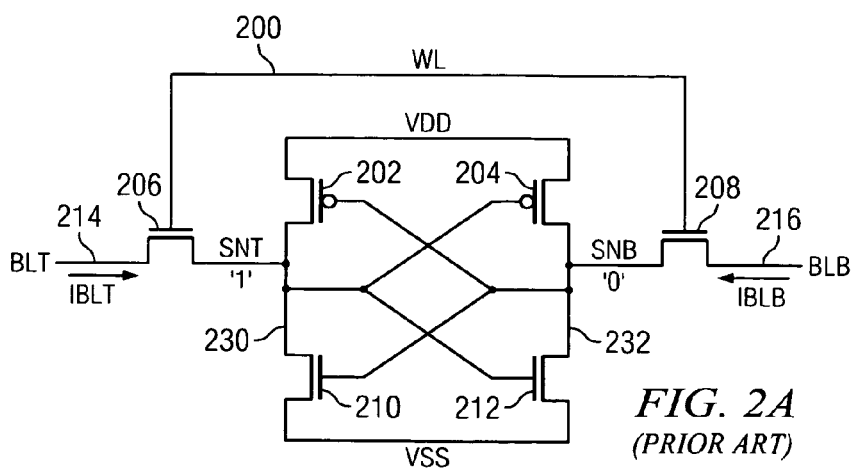
FIG. 2A is a six transistor (6-T) static random access memory (SRAM) cell of the prior art.
Figure 3:
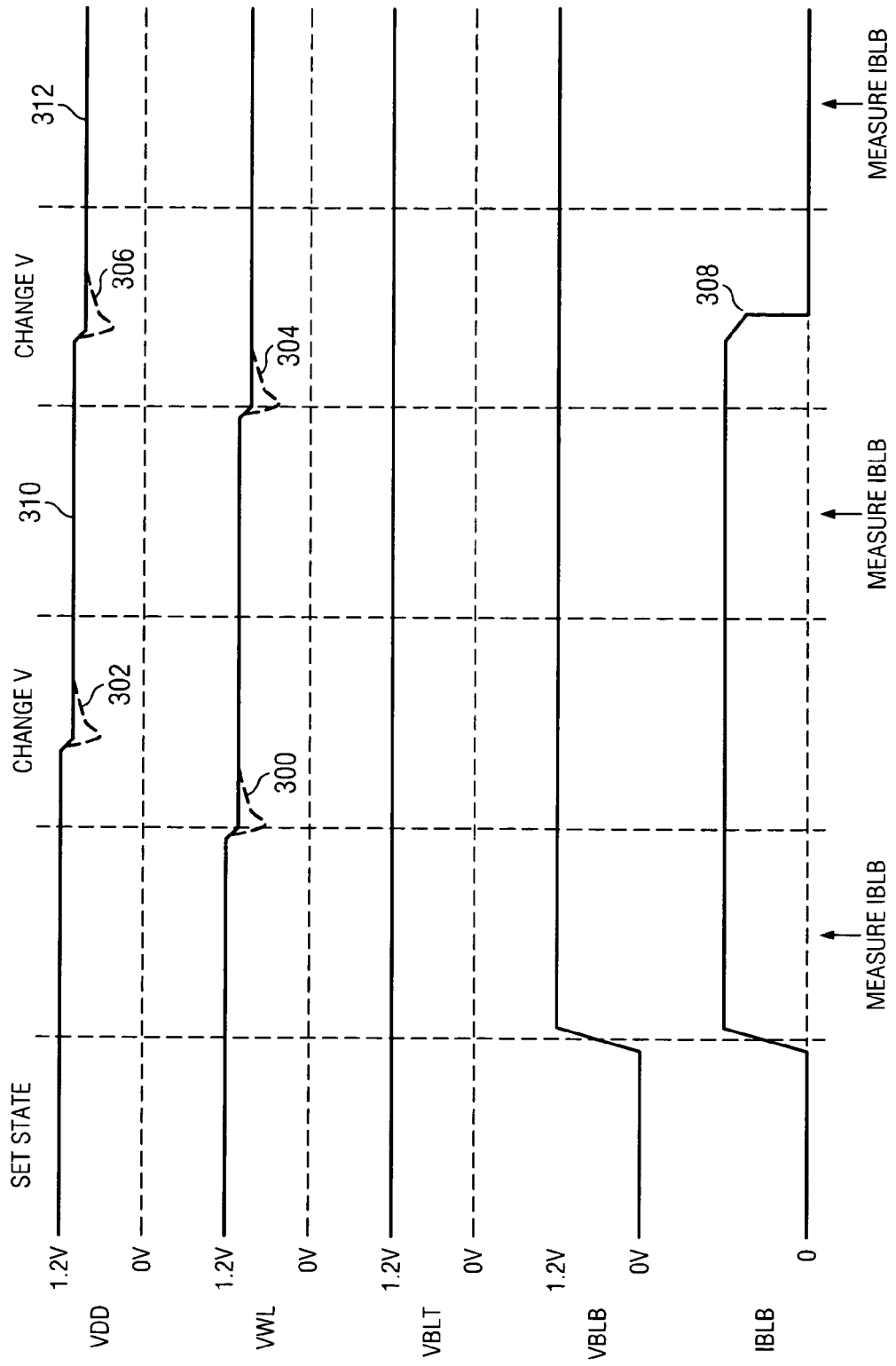
FIG. 3 is a timing diagram showing overshoot of VDD and VWL during voltage steps.

The present inventors have determined that parasitic elements of a parametric test system may produce unexpected and inaccurate results. Referring to FIG. 3, there is a timing diagram showing exemplary waveforms produced by such a production test system performing a minimum disturb operating voltage (Vmindis) test. Here, solid lines indicate expected waveforms. Dashed lines (300, 302, 304, 306) indicate overshoot waveforms observed with an oscilloscope during the test. Recall from a previous discussion of the Vmin test that the memory cell is initialized to a true '1', VBLT and VBLB are set high, and VDD and VWL are incrementally reduced. IBLB is measured after each reduction as indicated. At the first two values of VDD and VWL, IBLB remains high. When VDD and VWL are reduced a second time from the value at 310 to 312, the overshoot 306 may be as much as 200 mV below the intended value of VDD 312. This overshoot 306 is sufficient to induce a data state change of the memory cell as indicated by an abrupt drop in IBLB at 308. IBLB is subsequently measured, and Vmin is incorrectly determined to be between the value of VDD at 310 and 312.

Figure 4:
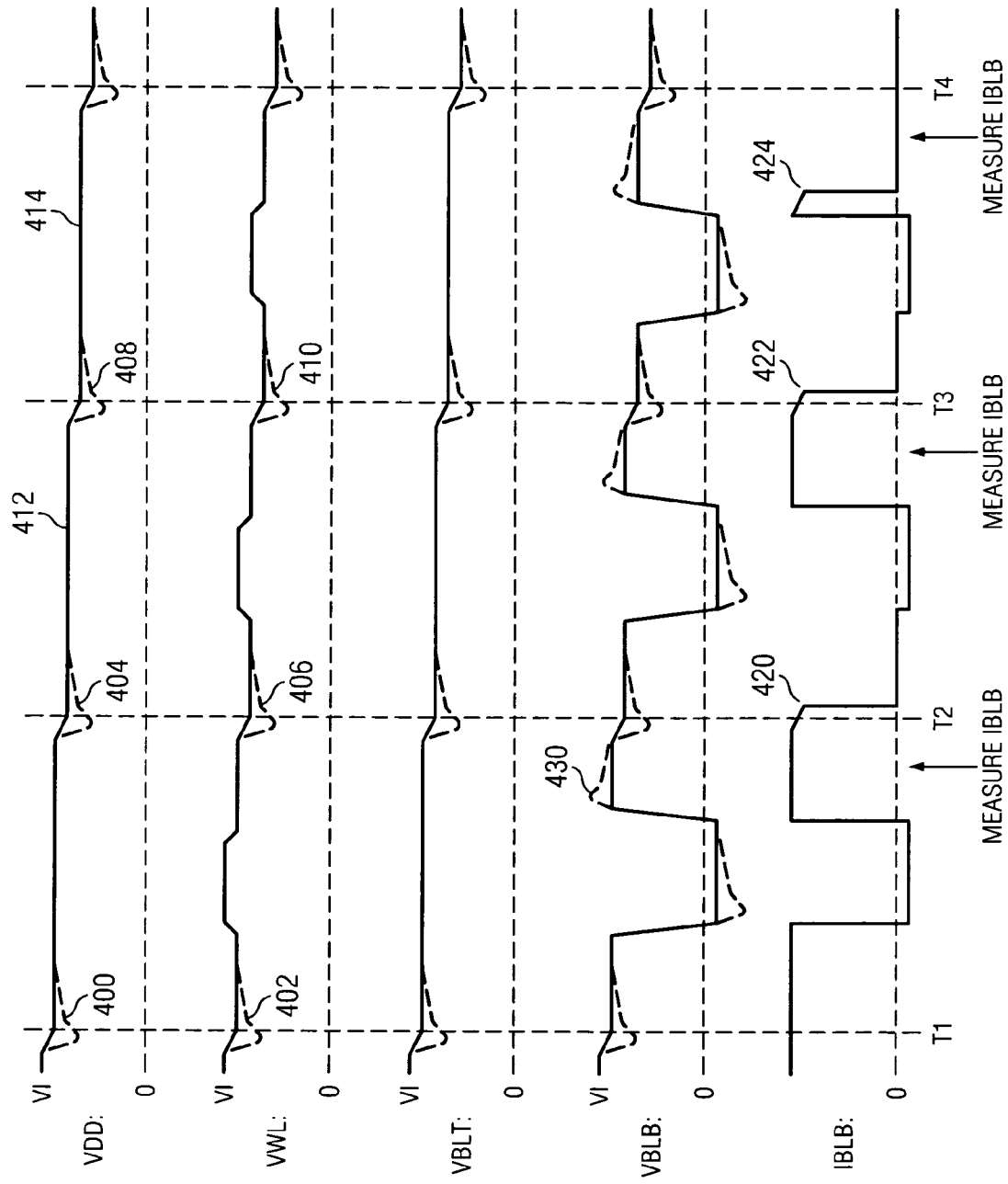
FIG. 4 is a timing diagram showing an improved test method of the present invention for measuring minimum disturb operating voltage.
Figure 5:
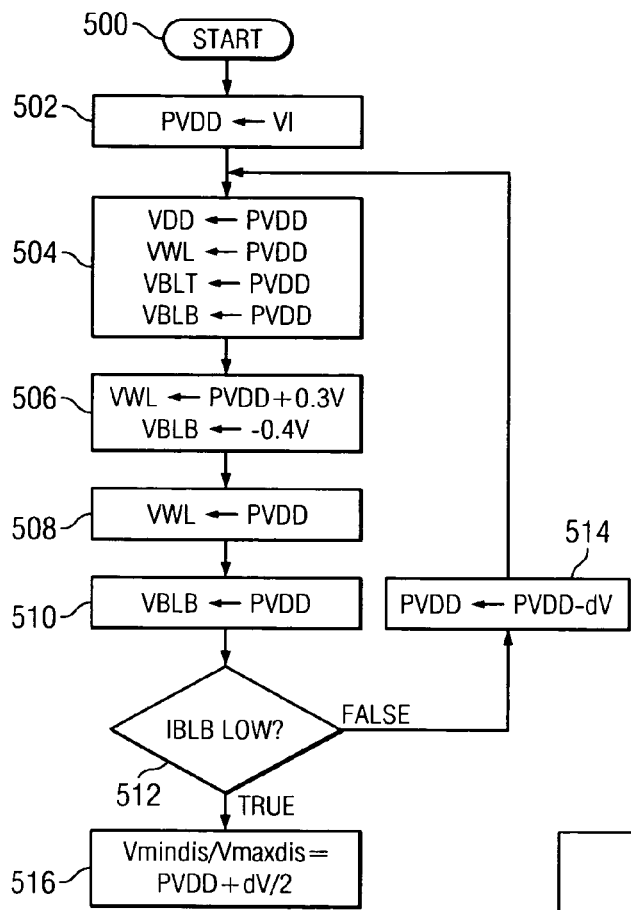
FIG. 5 is a flow chart showing an improved test method of the present invention for measuring minimum (Vmindis) or maximum (Vmaxdis) disturb operating voltage.

Referring now to FIG. 4, there is a timing diagram illustrating an improved minimum disturb operating voltage (Vmindis) test method of the present invention. The timing diagram will be discussed with reference to the flow chart of FIG. 5. As previously discussed, the dashed lines 400-410 and 430 are overshoot voltages which previously provided inaccurate test results. The improved test method starts at step 500. At step 502, a program VDD (PVDD) is set to an initial voltage (VI). After time T1 at step 504, VDD, VWL, VBLT, and VBLB are initialized to PVDD. Current IBLB is high. At step 506, VWL is set to PVDD+0.3V, and VBLB is set to −0.4 V to write a true "1" to the memory cell. This advantageously ensures that the memory cell data state has not been upset by previous overshoot voltages and stores a true "1" prior to IBLB measurement. At step 508, VWL is again set to PVDD. At step 510, VBLB is also set to PVDD. The overshoot 430 does not affect the test, since VWL is also at PVDD and transistor 208 is saturated. After overshoot 430 has settled, IBLB is measured at step 512. IBLB remains high, so control is transferred to step 514. PVDD is decremented by a small voltage (dV), and control is transferred back to step 504.

At time T2 and step 504 VDD, VWL, VBLT, and VBLB are set to the new value of PVDD 412. Here, however, overshoot 404 is sufficient to upset the data state of the memory cell. Thus, current IBLB goes low 420. It should be understood that IBLB is shown at zero by way of illustration. In practice, IBLB may be a low nonzero value. At step 506, VWL is set to PVDD+0.3 V, and VBLB is set to −0.4 V to write a true "1" to the memory cell. This resets the memory cell data state to the previous true "1" prior to IBLB measurement. At step 508, VWL is again set to PVDD. At step 510, VBLB is also set to PVDD. IBLB is again measured at step 512. IBLB remains high, since the overshoot 404 caused the data state upset rather than the intended value of PVDD. Therefore, control is again transferred to step 514. PVDD is again decremented by dV, and control is transferred back to step 504.

At time T3 and step 504 VDD, VWL, VBLT, and VBLB are set to the new value of PVDD 414. Once again overshoot 408 is sufficient to upset the data state of the memory cell. Thus, current IBLB goes low 422. At step 506, VWL is set to PVDD+0.3 V, and VBLB is set to −0.4 V to write a true "1" to the memory cell. This resets the memory cell data state to the previous true "1" prior to IBLB measurement. At step 508, VWL is again set to PVDD. At step 510, VBLB is also set to PVDD. Here, however, the value of PVDD 414 is sufficient to upset the memory cell state even without overshoot 408. Thus, IBLB immediately returns low 424. IBLB is again measured at step 512. IBLB is now low, so control passes to step 516. At step 516 the minimum operating voltage Vmindis is between the previous PVDD level 412 and the current PVDD level 414. Thus, Vmindis is set to the current PVDD level 414 plus dV/2.

A maximum disturb operating voltage (Vmaxdis) parametric test method of the present invention is similar to the previously described Vmindis parametric test method. Vmaxdis is the maximum voltage at which the memory cell does not fail during read disturb. In operation, however, the voltage dV (FIG. 5) is added to PVDD at block 514 so that VDD, VWL, VBLT, and VBLB are incremented at block 504 rather than decremented. Since the test voltages are incremented, VWL may remain at PVDD and a low value of 0 V for VBLB at block 506 may be sufficient to rewrite the memory cell data state. Finally, the final value of Vmaxdis is taken as PVDD−dV/2 at block 516.

Figure 6:
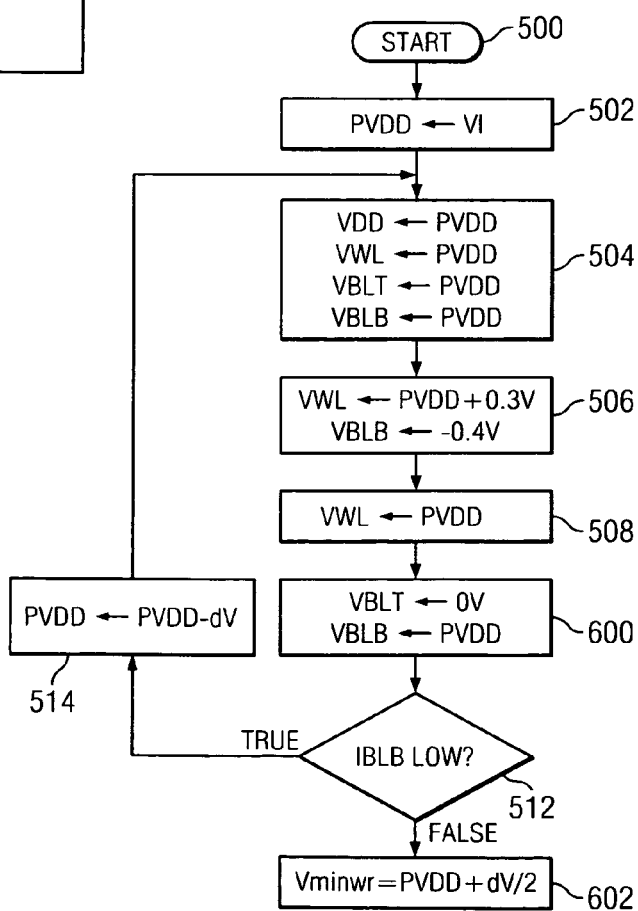
FIG. 6 is a flow chart showing an improved test method of the present invention for measuring minimum write voltage (Vminwr)

Referring now to FIG. 6, there is a flow chart illustrating another embodiment of the present invention applied to a minimum write operating voltage (Vminwr) parametric test. Vminwr is the minimum voltage at which the memory cell can be written. Reference numerals from FIG. 5 indicate the same function in FIG. 6. The test method starts at step 500. At step 502, a program VDD (PVDD) is set to an initial voltage (VI). At step 504, VDD, VWL, VBLT, and VBLB are initialized to PVDD. At step 506, VWL is set to PVDD+0.3V, and VBLB is set to −0.4 V to write a true "1" to the memory cell. This advantageously ensures that the memory cell data state has not been upset by previous overshoot voltages and stores a true "1" prior to IBLB measurement. At step 508, VWL is again set to PVDD. At step 600, VBLT is set to 0 V and VBLB is set to PVDD to write a true "0" into the memory cell. IBLB is measured at step 512. If the write operation is successful, IBLB is low and control is transferred to step 514. PVDD is decremented by a small voltage (dV), and control is transferred back to step 504. The process continues until the write operation fails as indicated by a high value of IBLB. Control is then transferred to block 602 where Vminwr is determined to be between the previous and current values of PVDD (PVDD+dV/2).

Figure 7:
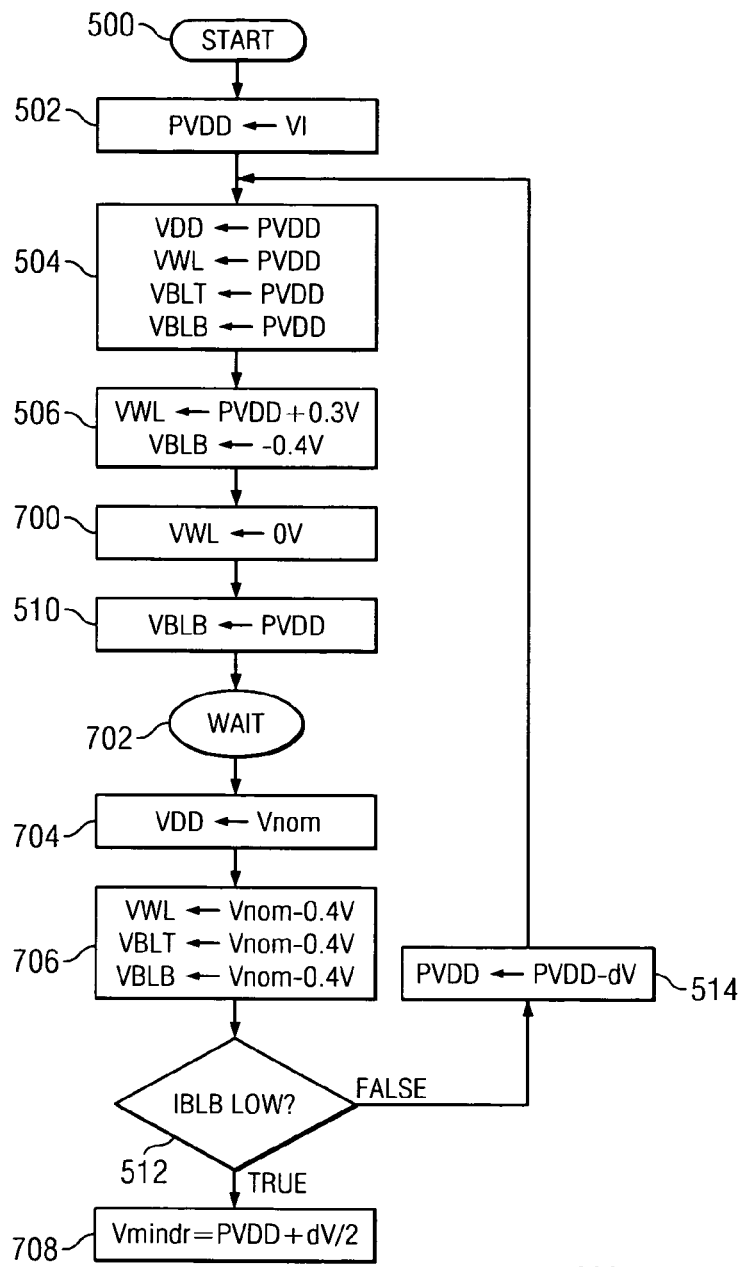
FIG. 7 is a flow chart showing an improved test method of the present invention for measuring minimum data retention voltage (Vmindr)

Referring next to FIG. 7, there is a flow chart illustrating yet another embodiment of the present invention applied to a minimum data retention operating voltage (Vmindr) parametric test. Vmindr is the minimum voltage at which the memory cell can retain data. As previously described, reference numerals from FIG. 5 indicate the same function in FIG. 7. The test method starts at step 500. At step 502, a program VDD (PVDD) is set to an initial voltage (VI). At step 504, VDD, VWL, VBLT, and VBLB are initialized to PVDD. At step 506, VWL is set to PVDD+0.3 V, and VBLB is set to −0.4 V to write a true "1" to the memory cell. This advantageously ensures that the memory cell data state has not been upset by previous overshoot voltages and stores a true "1" prior to IBLB measurement. At step 700, VWL is set to 0 V to turn off access transistors 206 and 208. At step 510, VBLB is set to PVDD. At step 702 a wait operation occurs for a predetermined time. This predetermined time is preferably greater than a time required for the memory cell data state fail change. At step 704 VDD is set to a nominal operating voltage (Vnom) where the memory cell is expected to operate normally. At step 706, VWL, VBLT, and VBLB are all set to Vnom−0.4 V. IBLB is measured at step 512. If IBLB remains high, the previously written true "1" was retained during wait period 702. Control is then transferred to step 514. PVDD is decremented by a small voltage (dV), and control is transferred back to step 504. The process continues until the true "1" data state is upset during wait period 702 as indicated by a low value of IBLB. Control is then transferred to block 708 where Vmindr is determined to be between the previous and current values of PVDD (PVDD+dV/2).

The present parametric test method advantageously avoids inaccurate test results by rewriting the data state of the memory cell immediately before measuring IBLB. The state of the memory cell, therefore, is determined by the level of PVDD rather than a voltage overshoot or other noise. Although the foregoing embodiment of the test method searched for the minimum operating voltage by successively decrementing PVDD, one of ordinary skill in the art with access to the instant specification will appreciate that the same result will be obtained by incrementing PVDD, interval halving PVDD or other search schemes.

Figure 8A:
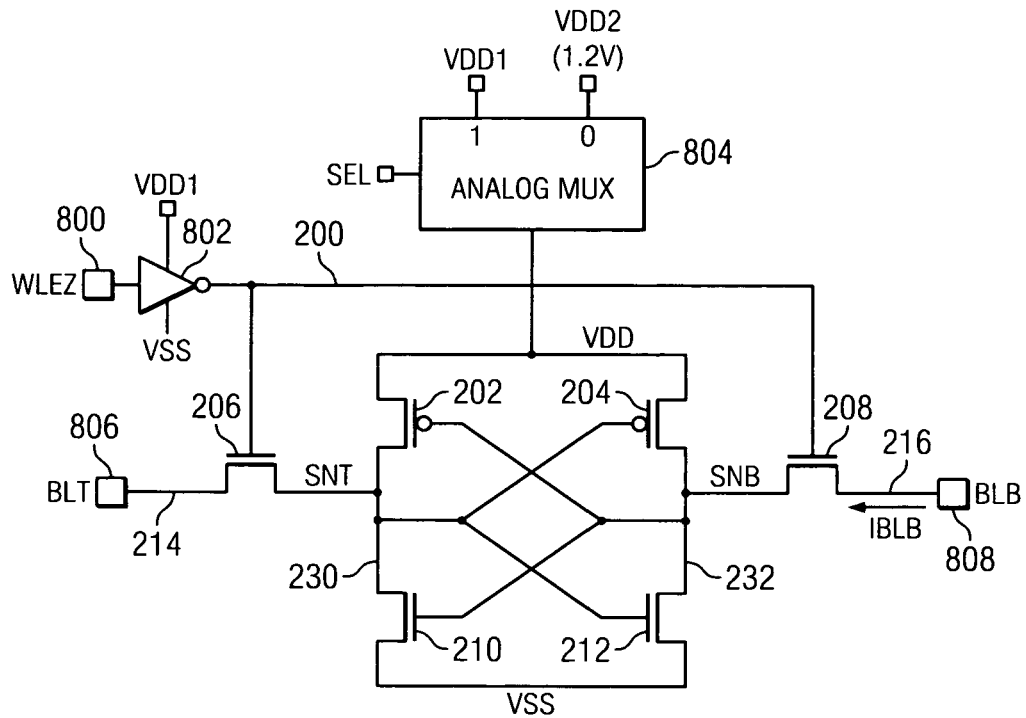
FIG. 8A is a first embodiment of a parametric test circuit of the present invention to improve the memory cell operating voltage parametric test.

Referring now to FIG. 8A, there is a first embodiment of an improved parametric test circuit of the present invention. The circuit includes P-channel drive transistors 202 and 204 and N-channel drive transistors 210 and 212. The drive transistors are connected in a cross coupled manner as shown to form a latch. A first access transistor 206 has a current path connected between a true terminal (SNT) 230 of the latch and a first access terminal (BLT) 214 and has a first control terminal 200. The first access terminal 214 is connected to test pad 806. A second access transistor 208 has a current path connected between a complementary terminal (SNB) 232 of the latch and a second access terminal (BLB) 216 and has a second control terminal connected to the first control terminal. The second access terminal 216 is connected to test pad 808. The first (BLT) and second (BLB) access terminals are arranged so that they may be independently controlled. Thus, one access terminal may be held high while the other access terminal is incrementally changed. A logic circuit 802, which is an inverter in this case, has an output terminal (WL) coupled to the first and second control terminals and has an input terminal at test pad 800 coupled to receive an active low enable signal (WLEZ). Alternatively, the logic circuit may comprise other logic gates such as NAND, NOR, or other suitable logic gates. An analog multiplex circuit 804 is arranged to supply one of VDD1 or VDD2 to the VDD terminal of the memory cell in response to a level of select signal SEL.

In operation, the enable signal (WLEZ) goes high prior to each transition of VDD. The enable signal returns low after each overshoot, and the values of VBLT, VBLB, and VDD have settled to the intended values. Moreover, the transitions of VDD are isolated by analog multiplex circuit 804. VDD1 is selected by a high level of select signal SEL and applies a current value of VDD1 to the VDD terminal of the memory cell. Alternatively, VDD2 is selected by a low level of select signal SEL and applies a nominal value of 1.2 V to the VDD terminal of the memory cell. VDD1 is successively decremented. However, before each transition of VDD1 select signal SEL goes low to apply VDD2 to the VDD terminal of the memory cell. Once the value of VDD1 has settled to the intended value, select signal SEL goes high to apply VDD1 to the VDD terminal of the memory cell. Preferably, analog multiplex circuit 804 is fabricated in close proximity to the memory cell so that parasitic inductance of interconnect is small. Thus, overshoot due to the transition from VDD1 to VDD2 and from VDD2 to VDD1 is negligible and does not affect the data state stored in the latch circuit of the memory cell.

Figure 8B:
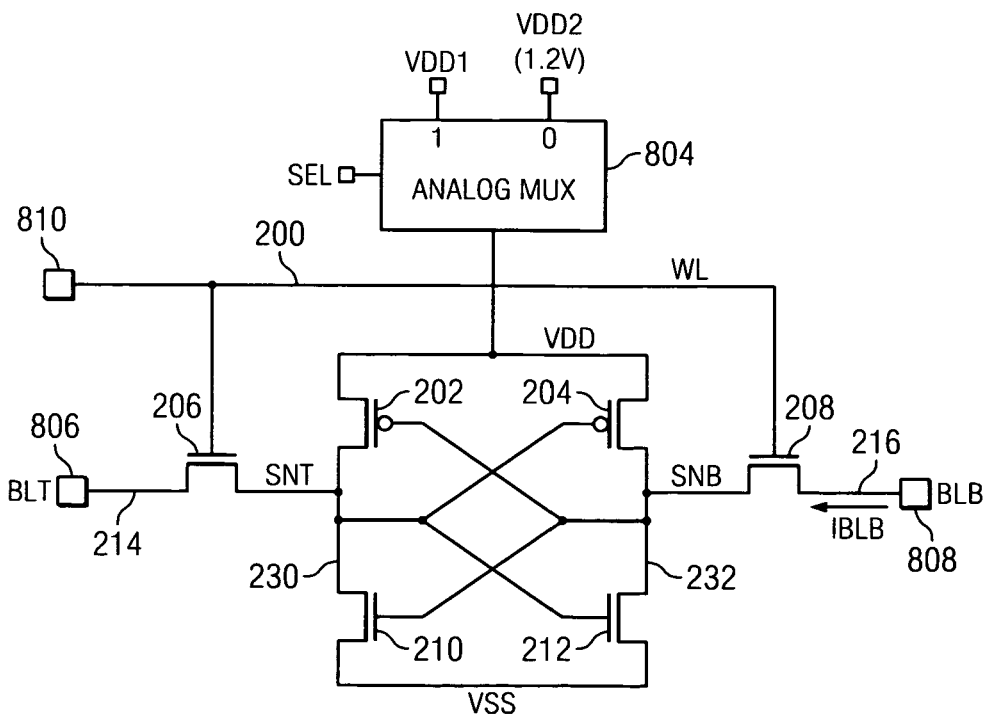
FIG. 8B is a second embodiment of a parametric test circuit of the present invention to improve the memory cell operating voltage parametric test.

Referring now to FIG. 8B, there is a second embodiment of an improved parametric test circuit of the present invention. The circuit is the same as previously described in FIG. 8A except the logic circuit 802 is omitted. The word line (WL) signal is applied to lead 200 via test pad terminal 810. In operation, therefore, the analog multiplex circuit isolates the overshoot due to VDD1 transitions. VDD1 is selected by a high level of select signal SEL and applies a current value of VDD1 to the VDD terminal of the memory cell. Alternatively, VDD2 is selected by a low level of select signal SEL and applies a nominal value of 1.2 V to the VDD terminal of the memory cell. VDD1 is successively decremented. However, before each transition of VDD1 select signal SEL goes low to apply VDD2 to the VDD terminal of the memory cell. Once the value of VDD1 has settled to the intended value, select signal SEL goes high to apply VDD1 to the VDD terminal of the memory cell. Preferably, analog multiplex circuit 804 is fabricated in close proximity to the memory cell so that parasitic inductance of interconnect is small. Thus, overshoot due to the transition from VDD1 to VDD2 and from VDD2 to VDD1 is negligible and does not affect the data state stored in the latch circuit of the memory cell.

Figure 9:
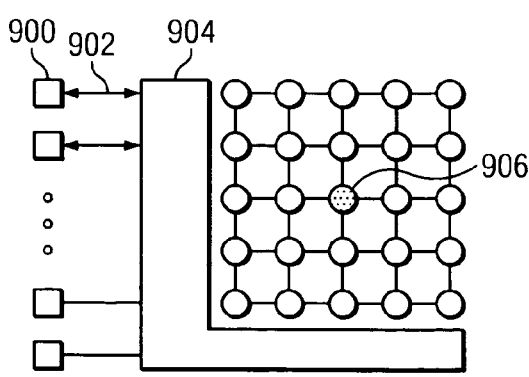
FIG. 9 is a block diagram of a test circuit having an array of memory cells and may include the test circuits of FIG. 8A or 8B.

Referring now to FIG. 9, there is a block diagram of a test circuit having an array of memory cells and may include the test circuits of FIG. 8A or 8B. The test circuit includes plural test pads such as test pad 900 connected to logic circuit 904 via leads 902. Leads 902 preferably include data, control, and power supply connections for operating the test circuit. Memory cells of the array are indicated by circles. Memory cells of test circuits previously described with reference to FIGS. 8A and 8B are preferably located in a central part array as indicated by memory cell 906. Memory cell 906 is advantageously surrounded by neighboring memory cells under nominal bias conditions to avoid edge effects that may influence the test.

Still further, while numerous examples have thus been provided, one skilled in the art should recognize that various modifications, substitutions, or alterations may be made to the described embodiments while still falling with the inventive scope as defined by the following claims. For example, in the previous discussion an abrupt drop in measured IBLB indicates a change of data state of the memory cell under test. An abrupt increase in measured IBLT may also be used to indicate the same change of data state. Other combinations will be readily apparent to one of ordinary skill in the art having access to the instant specification.

What is claimed is:
1. A test circuit, comprising:
a latch circuit having true and complementary terminals and having a power supply terminal;
a first access transistor having a current path connected between the true terminal and a first access terminal and having a first control terminal;
a second access transistor having a current path connected between the complementary terminal and a second access terminal and having a second control terminal connected to the first control terminal;
a multiplex circuit arranged to apply a first voltage to the power supply terminal in response to a first state of a select signal and to apply a second voltage to the power supply terminal in response to a second state of a select signal.

2. A test circuit, as in claim 1, wherein the latch circuit and the first and second access transistors comprise a static random access memory cell.

3. A test circuit, as in claim 2, wherein the static random access memory cell is one of an array of memory cells.

4. A test circuit, as in claim 3, wherein the array of memory cells comprises a static random access memory circuit arranged to operate in a design for test mode.

5. A test circuit, as in claim 1, comprising an array of memory cells.

6. A test circuit, as in claim 1, wherein the first voltage is variable and wherein the second voltage is constant.

7. A test circuit, as in claim 1, wherein each of the first and second access terminals is coupled to a respective test pad.

8. A test circuit, comprising:
  a complementary metal oxide semiconductor (CMOS) latch circuit having true and complementary terminals, a first drive transistor having a current path connected to the true terminal plus a control terminal connected to the complementary terminal, and a second drive transistor having a current path connected to the complementary terminal plus a control terminal connected to the true terminal;
  a first access transistor having a current path connected between the true terminal and a first access terminal and having a first control terminal;
  a second access transistor having a current path connected between the complementary terminal and a second access terminal and having a second control terminal connected to the first control terminal; and
  a logic circuit having an output terminal coupled to the first and second control terminals and having an input terminal coupled to receive an enable signal.

9. A test circuit, as in claim 8, wherein the CMOS latch circuit and the first and second access transistors comprise a static random access memory cell.

10. A test circuit, as in claim 9, wherein the static random access memory cell is one of an array of memory cells.

11. A test circuit, as in claim 10, wherein the array of memory cells comprises a static random access memory circuit arranged to operate in a design for test mode.

12. A test circuit, as in claim 8, comprising an array of memory cells.

13. A test circuit, as in claim 8, wherein the input terminal of the logic circuit is coupled to a test pad.

14. A test circuit, as in claim 13, wherein the logic circuit comprises an inverter.

15. A test circuit, as in claim 8, wherein each of the first and second access terminals is coupled to a respective test pad.

16. A method of testing a memory cell having first and second data terminals and having a power supply terminal, comprising the steps of:
  (a) writing a data state in the memory cell;
  (b) applying a next test voltage to the power supply terminal;
  (c) writing the data state in the memory cell after the step of applying;
  (d) measuring a current through one of the first and second data terminals;
  (e) repeating steps (b) through (d) in response to a first value of the current; and
  (f) terminating the test in response to a second value of the current.

17. A method of testing as in claim 16, wherein the memory cell is a static random access memory cell.

18. A method of testing as in claim 16, wherein the step of applying a next test voltage comprises applying an incrementally lower voltage at each successive step (b).

19. A method of testing as in claim 16, wherein the step of applying a next test voltage comprises applying a selected test voltage different from a previous test voltage at each successive step (b) until step (d) measures the second value of the current.

20. A method of testing as in claim 16, wherein the step of applying a next test voltage comprises applying a plurality of test voltages and recording the current into the second data terminal at each respective test voltage.

21. A method of testing as in claim 16, comprising the step of increasing a word line voltage and restoring the word line voltage at the memory cell after step (c) and before step (d).

22. A method of testing as in claim 16, comprising the step of changing a supply voltage at the memory cell from a first voltage to a second voltage and back to the first voltage after step (c) and before step (d).

23. A method of testing as in claim 16, comprising testing an operating voltage of a memory cell.

24. A method of testing as in claim 18, wherein one of the first and second values of the current comprises a first range of values of current.

25. A method of testing as in claim 24, wherein another of the first and second values of the current comprises a second range of values of current different from the first range of values of current.

26. A method of testing as in claim 16, comprising the step of increasing a voltage on one of the first and second data terminals after step (c) and before step (d).

* * * * *